US012140863B2

(12) United States Patent
Fang et al.

(10) Patent No.: US 12,140,863 B2
(45) Date of Patent: Nov. 12, 2024

(54) IMPRINT METHOD

(71) Applicant: UNITED MICROELECTRONICS CORP., Hsin-Chu (TW)

(72) Inventors: Su-Yun Fang, Tainan (TW); Chih-Hsien Tang, Taipei (TW); Yi-Lin Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 432 days.

(21) Appl. No.: 17/750,421

(22) Filed: May 23, 2022

(65) Prior Publication Data
US 2023/0350287 A1 Nov. 2, 2023

(30) Foreign Application Priority Data
Apr. 27, 2022 (TW) .................................. 111116015

(51) Int. Cl.
*G03F 7/00* (2006.01)
*H01L 21/308* (2006.01)
*H01L 21/311* (2006.01)
*H01L 21/3213* (2006.01)

(52) U.S. Cl.
CPC ........ *G03F 7/0002* (2013.01); *H01L 21/3086* (2013.01); *H01L 21/31144* (2013.01); *H01L 21/32139* (2013.01)

(58) Field of Classification Search
None
See application file for complete search history.

(56) References Cited

U.S. PATENT DOCUMENTS

| 7,520,742 | B2 | 4/2009 | Motowaki |
| 7,708,924 | B2 | 5/2010 | Kolesnychenko |
| 7,976,748 | B2 | 7/2011 | Rogers |
| 8,007,631 | B2 | 8/2011 | Dakshina-Murthy |
| 8,795,775 | B2 | 8/2014 | Koo |
| 2010/0230864 | A1 | 9/2010 | Park |
| 2015/0044417 | A1* | 2/2015 | Koike ................... B32B 27/325 |
| | | | 264/447 |

* cited by examiner

Primary Examiner — Hsien Ming Lee
(74) Attorney, Agent, or Firm — Winston Hsu

(57) ABSTRACT

An imprint method includes the following steps. A first resist layer is formed on a first substrate. A first imprinting step using a first mold is performed to the first resist layer. A first etching process is performed to the first substrate with the first resist layer as an etching mask after the first imprinting step so as to form a first recess pattern in the first substrate. A second resist layer is formed on the first substrate. A second imprinting step using a second mold is performed to the second resist layer. A second etching process is performed to the first substrate with the second resist layer as an etching mask after the second imprinting step so as to form second recess patterns in the first substrate. A depth of the first recess pattern is greater than a depth of each of the second recess patterns.

20 Claims, 21 Drawing Sheets

IMPRINT METHOD

BACKGROUND OF THE INVENTION

1. Field of the Invention

The present invention relates to an imprint method, and more particularly, to an imprint method for forming recess patterns with different depths.

2. Description of the Prior Art

Integrated circuit (IC) is constructed by devices and interconnections, which are formed by patterned feature in the substrate or different layers. In the fabrication of IC, the photolithography process is an essential technique. The photolithography process is configured to form designed patterns such as circuit layout patterns on one or more photomasks, and then to precisely transfer such patterns to a photoresist layer on a film by exposure and development steps. Subsequently, the complicated layout patterns are precisely transferred to a semiconductor chip.

With the miniaturization development in the semiconductor industry and the progress in semiconductor fabrication technology, the widely used conventional exposure techniques are gradually approaching their limits, and the corresponding process equipment and/or manufacturing costs have also increased significantly, which is not conducive to related development. Therefore, the nanoimprint lithography (NIL) method, which has the advantages of low cost, high resolution, and relatively shorter process time, is regarded as a patterning technology that can be applied in the semiconductor process. However, there are still many details and designs of the nanoimprint lithography method that need to be improved for meeting the requirements of manufacturing yield and device dimensional control stability in semiconductor manufacturing.

SUMMARY OF THE INVENTION

An imprint method is provided in the present invention. Imprinting steps and corresponding etching processes are used to form recess patterns with different depths in a substrate.

According to an embodiment of the present invention, an imprint method is provided. The imprint method includes the following steps. A first resist layer is formed on a first substrate. A first imprinting step using a first mold is performed to the first resist layer. After the first imprinting step, a first etching process is performed to the first substrate with the first resist layer as an etching mask so as to form at least one first recess pattern in the first substrate. A second resist layer is formed on the first substrate. A second imprinting step using a second mold is performed to the second resist layer. After the second imprinting step, a second etching process is performed to the first substrate with the second resist layer as an etching mask so as to form second recess patterns in the first substrate. A depth of the first recess pattern is greater than a depth of each of the second recess patterns.

According to another embodiment of the present invention, an imprint method is provided. The imprint method includes the following steps. A first resist layer is formed on a first substrate. A first imprinting step using a first mold is performed to the first resist layer. After the first imprinting step, a first etching process is performed to the first substrate with the first resist layer as an etching mask so as to form at least one first recess pattern in a first region of the first substrate and second recess patterns in a second region of the first substrate. A second resist layer is formed on the first substrate. A second imprinting step using a second mold is performed to the second resist layer. After the second imprinting step, a second etching process is performed to the first substrate with the second resist layer as an etching mask so as to form at least one third recess pattern in the first region of the first substrate. At least a part of the third recess pattern is formed under and connected with the first recess pattern, and a depth of the third recess pattern is greater than a depth of each of the second recess patterns.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating an imprint method according to a first embodiment of the present invention, wherein FIG. 1 is a schematic drawing illustrating a mold, FIG. 2 is a schematic drawing illustrating another mold, FIG. 3 is a schematic drawing illustrating an imprinting step, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

FIGS. 10-13 are schematic drawings illustrating an imprint method according to a second embodiment of the present invention, wherein FIG. 11 is a schematic drawing in a step subsequent to FIG. 10, FIG. 12 is a schematic drawing in a step subsequent to FIG. 11, and FIG. 13 is a schematic drawing in a step subsequent to FIG. 12.

FIGS. 14-21 are schematic drawings illustrating an imprint method according to a third embodiment of the present invention, wherein FIG. 14 is a schematic drawing illustrating a mold, FIG. 15 is a schematic drawing illustrating another mold, FIG. 16 is a schematic drawing illustrating an imprinting step, FIG. 17 is a schematic drawing in a step subsequent to FIG. 16, FIG. 18 is a schematic drawing in a step subsequent to FIG. 17, FIG. 19 is a schematic drawing in a step subsequent to FIG. 18, FIG. 20 is a schematic drawing in a step subsequent to FIG. 19, and FIG. 21 is a schematic drawing in a step subsequent to FIG. 20.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
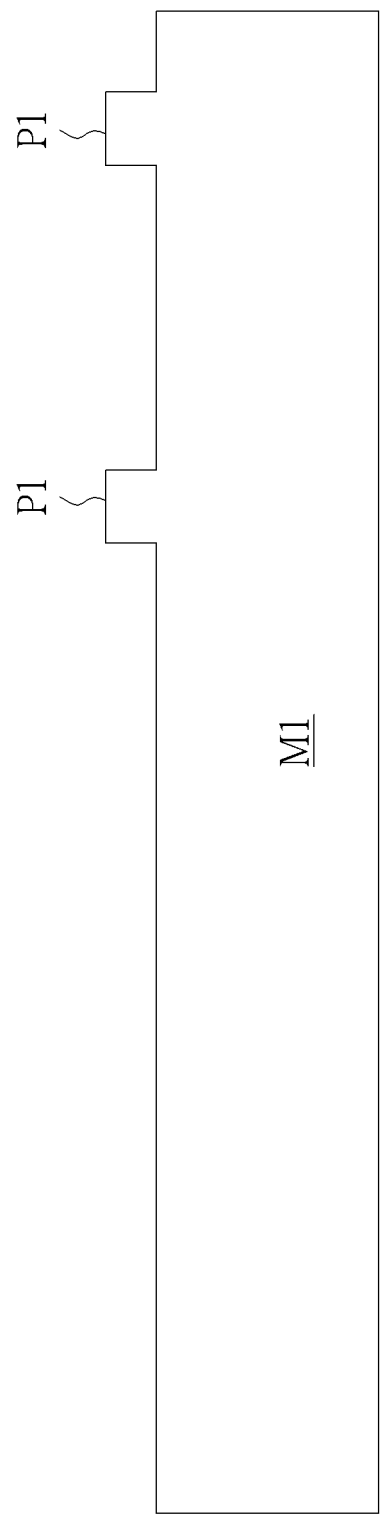
Figure 2:
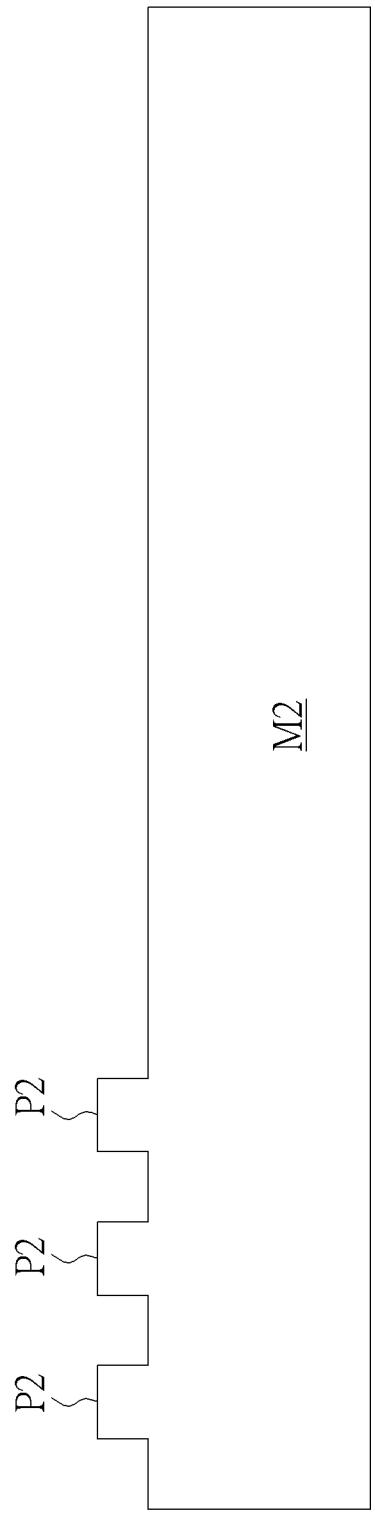
Figure 3:
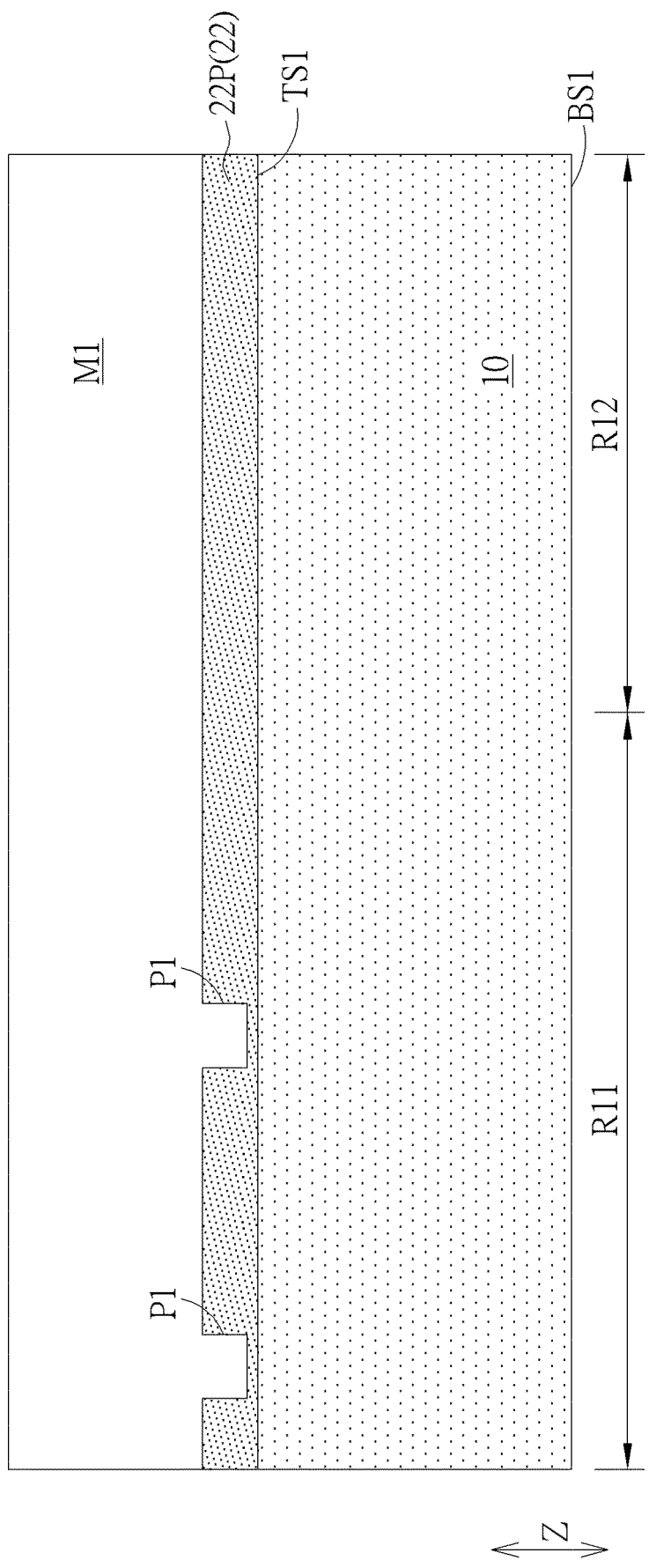
Figure 4:
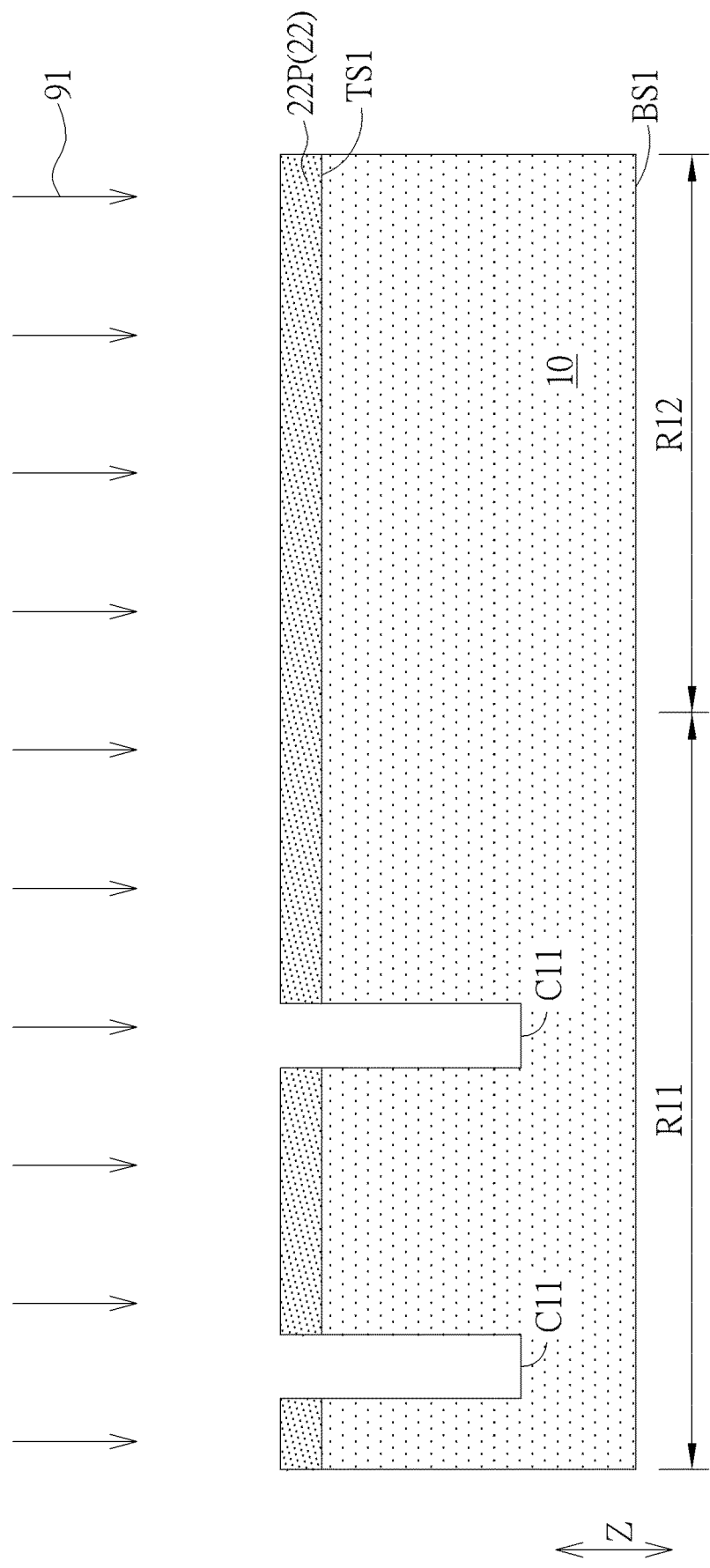
Figure 5:
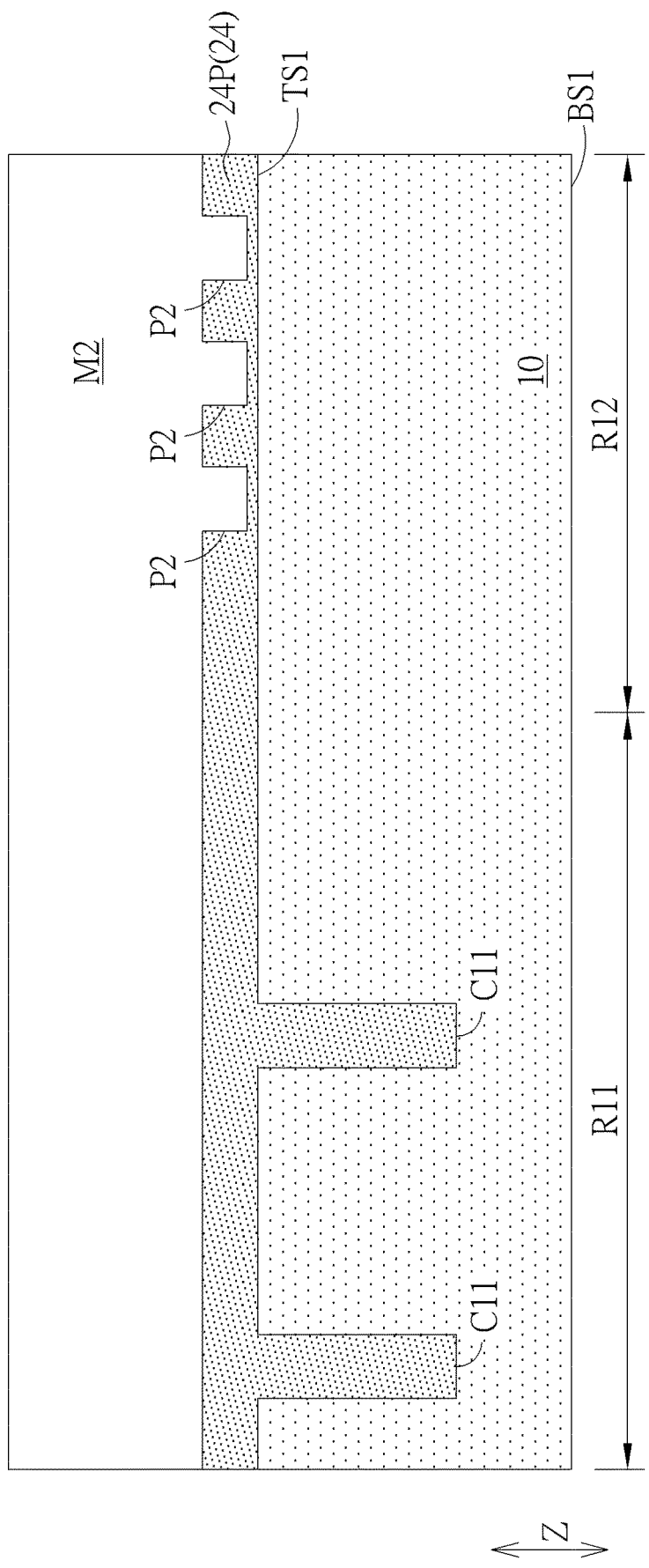
Figure 6:
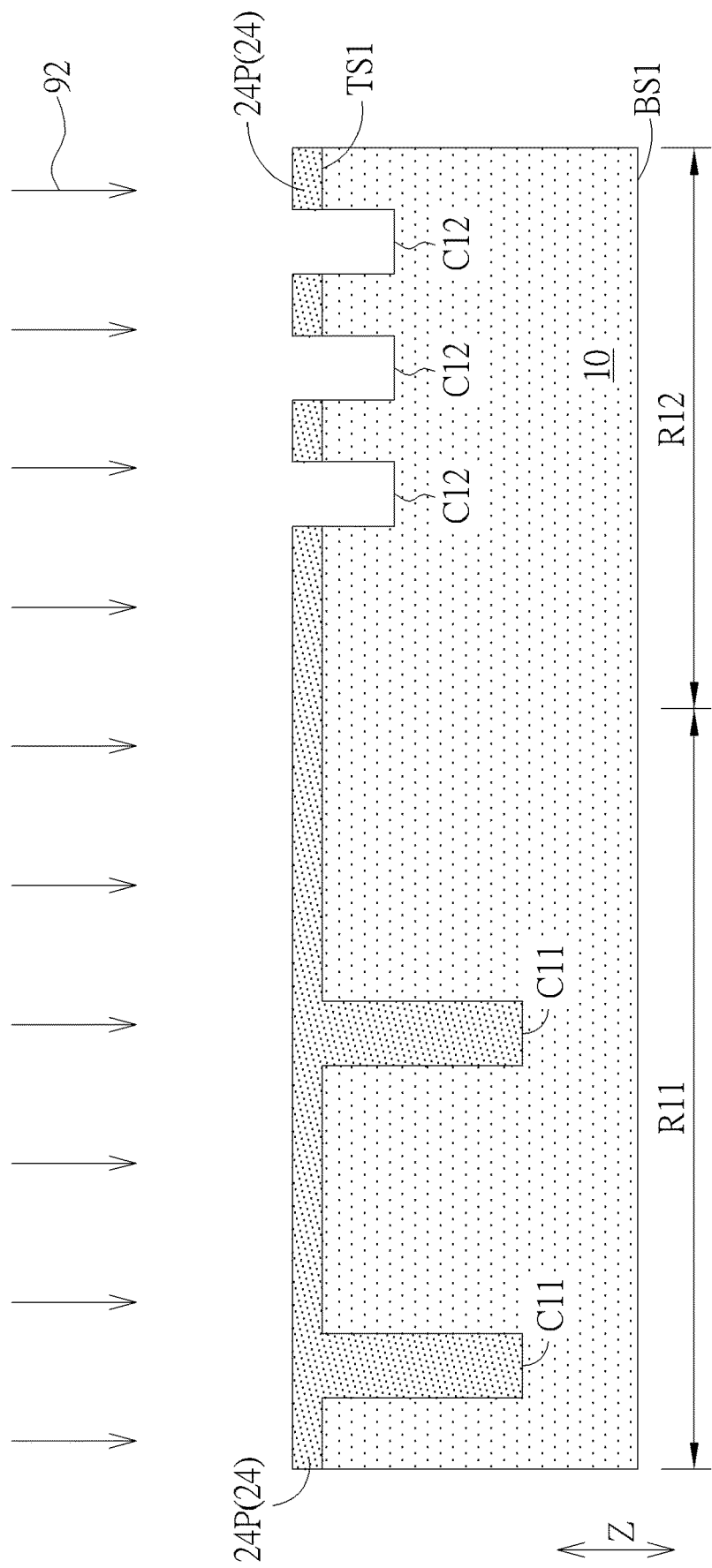
Figure 7:
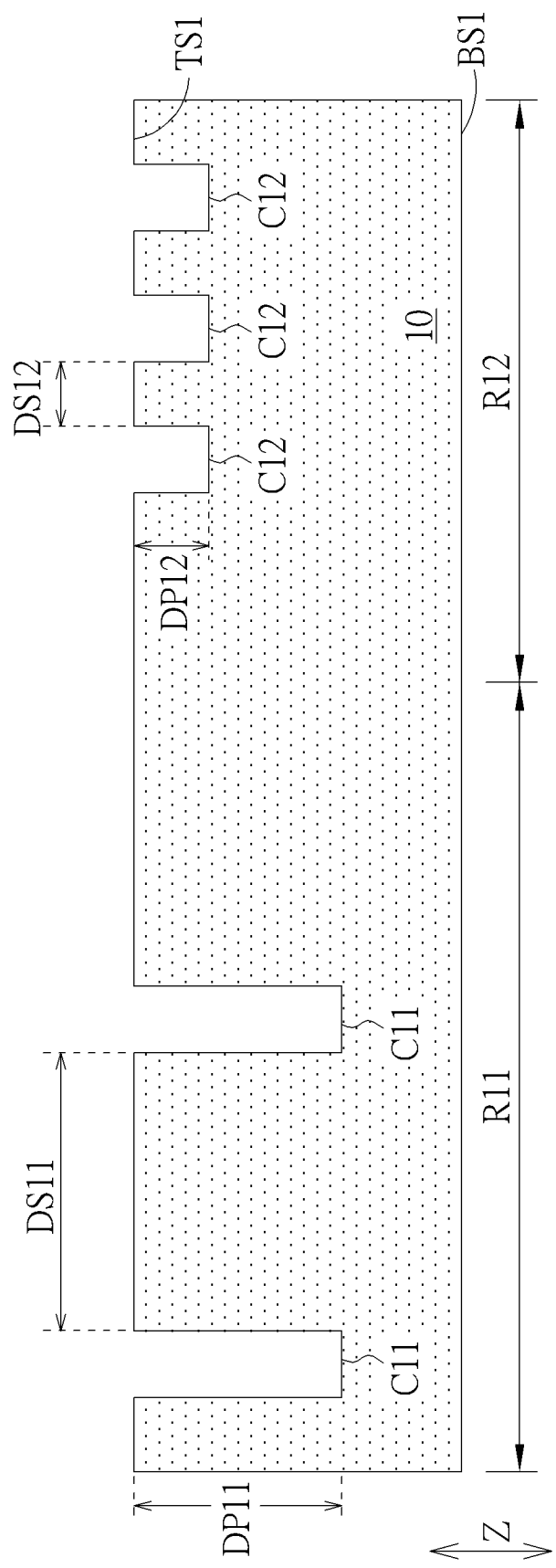
Figure 8:
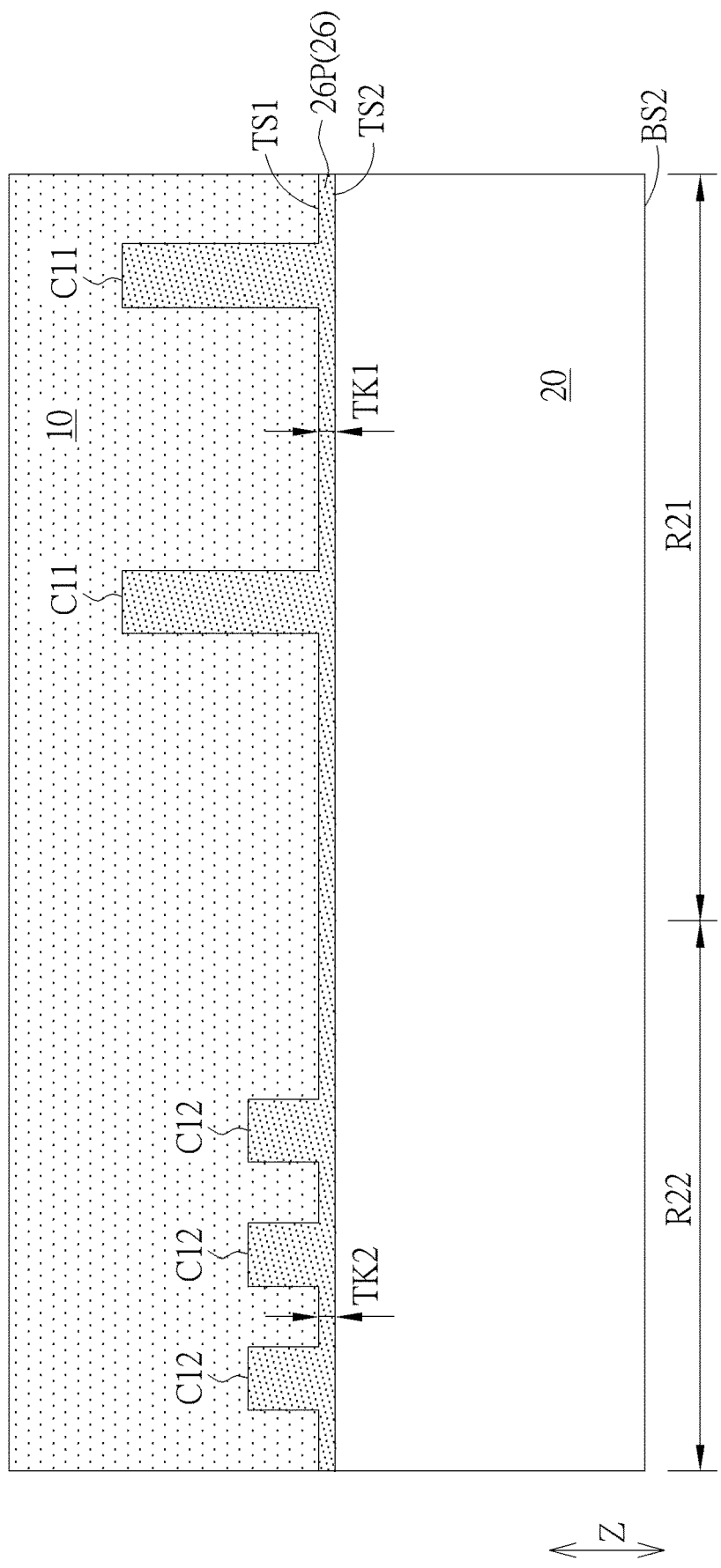
Figure 9:
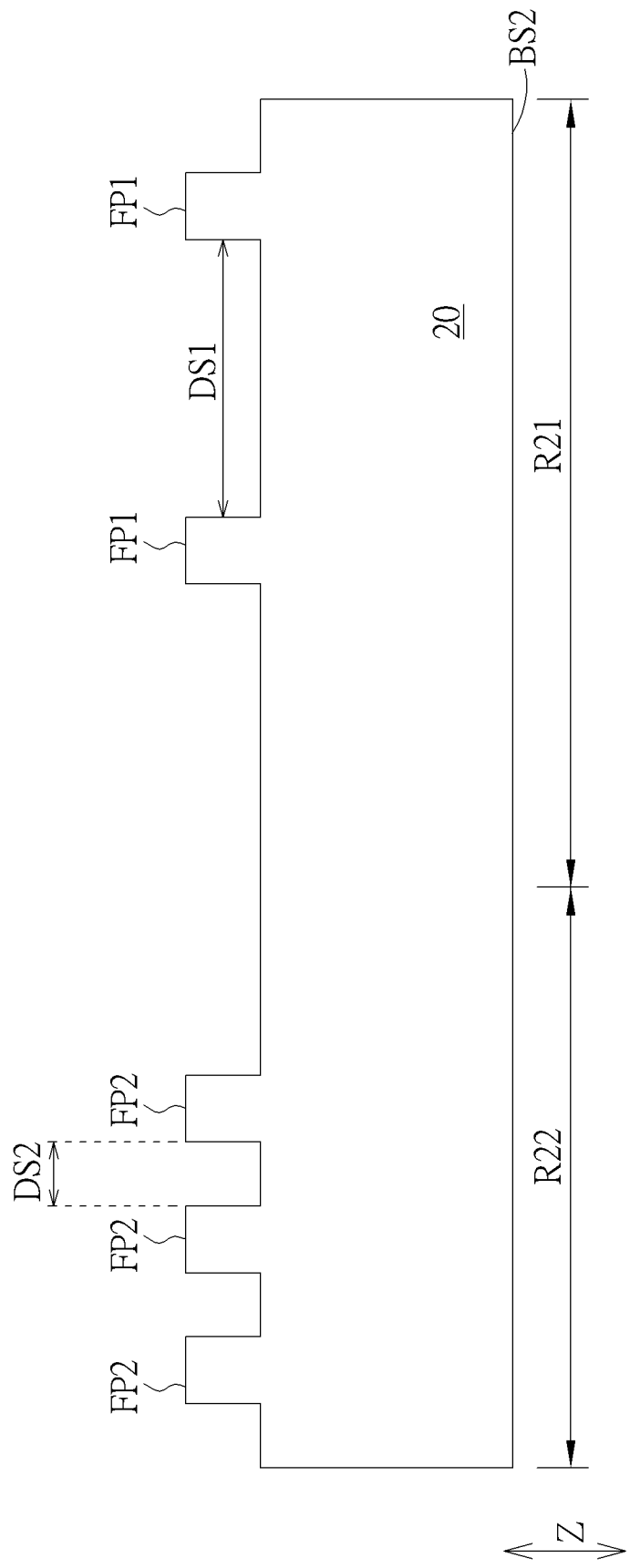

Please refer to FIGS. 1-9. FIGS. 1-9 are schematic drawings illustrating an imprint method according to a first embodiment of the present invention, wherein FIG. 1 is a schematic drawing illustrating a mold M1, FIG. 2 is a schematic drawing illustrating a mold M2, FIG. 3 is a schematic drawing illustrating an imprinting step, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8. The imprint method in this embodiment may include the following steps. As shown in FIG. 1 and FIG. 2, a first mold and a second mold (such as a mold M1 illustrated in FIG. 1 and a mold M2 illustrated in FIG. 2) are provided. The mold M1 may include a plurality of protruding patterns P1, and the mold M2 may include a plurality of protruding patterns P2. Subsequently, as shown in FIG. 3, a resist layer 22 is formed on a first substrate 10, and an imprinting step using the mold M1 is performed to the resist layer 22. In some embodiments, the imprinting step using the mold M1 may be regarded as a first imprinting step, and FIG. 3 may be regarded as a schematic drawing illustrating the condition of the first imprinting step, but not limited thereto. As shown in FIG. 3 and FIG. 4, after the first imprinting step, an etching process 91 is then performed to the first substrate 10 with the resist layer 22 as an etching mask so as to form one or a plurality of recess patterns C11 in the first substrate 10. As shown in FIG. 5, another resist layer 24 is then formed on the first substrate 10, and another imprinting step using the mold M2 is performed to the resist layer 24. In some embodiments, the imprinting step using the mold M2 may be regarded as a second imprinting step, and FIG. 5 may be regarded as a schematic drawing illustrating the condition of the second imprinting step, but not limited thereto. As shown in FIG. 5 and FIG. 6, after the second imprinting step, an etching process 92 is performed to the first substrate 10 with the resist layer 24 as an etching mask so as to form one or a plurality of recess patterns C12 in the first substrate 10. A depth of the recess pattern C11 is greater than a depth of each of the recess patterns C12.

Specifically, as shown in FIG. 1 and FIG. 2, in some embodiments, the material of the mold M1 and the mold M2 may include silicon (such as a silicon substrate), glass (such as a transparent glass substrate), or other suitable materials. Additionally, in some embodiments, the protruding patterns P1 on the mold M1 and the protruding patterns P2 on the mold M2 may be formed by electron-beam lithography processes, the dimensions (such as widths, but not limited thereto) of the protruding pattern P1 and the protruding pattern P2 may down to the order of nanometers, and the imprint method in this embodiment may be regarded as a nanoimprint method accordingly, but not limited thereto. In some embodiments, the mold M1 including the protruding pattern P1 and the mold M2 including the protruding pattern P2 may be formed by other suitable manufacturing approaches according to some design considerations. In some embodiments, the pattern density of the protruding patterns P1 of the mold M1 may be different from that of the protruding patterns P2 of the mold M2. For instance, the pattern density of the protruding patterns P1 may be lower than the pattern density of the protruding patterns P2, but not limited thereto. It is worth noting that the pattern density used in this description may be defined as the number per unit area of a specific pattern in the area with this pattern, and the distance between the patterns with higher pattern density may be less than the distance between the patterns with lower pattern density, but not limited thereto. In other words, a distance between two of the protruding patterns P1 adjacent to each other may be greater than a distance between two of the protruding patterns P2 adjacent to each other. Additionally, a width of each of the protruding patterns P1 may be substantially equal to or different from a width of each of the protruding patterns P2. It is worth noting that, considering feasible process variation control, the condition that two specific values are substantially equal to each other in this description may include the condition that the two specific values are substantially equal to each other with a tolerance of ±5%, with a tolerance of ±10%, or with a tolerance within other suitable ranges.

As shown in FIG. 3, the first substrate 10 may have a top surface TS1 and a bottom surface BS1 opposite to the top surface TS1 in a vertical direction Z, the resist layer 22 may be formed on the side of the top surface TS1 of the first substrate 10, and the mold M1 may be imprinted on the resist layer 22 from the side of the top surface TS1 of the first substrate 10. The material of the first substrate 10 may include silicon (such as a silicon substrate), glass (such as a transparent glass substrate), or other suitable materials. In some embodiments, the vertical direction Z may be regarded as a thickness direction of the first substrate 10 or being parallel with the thickness direction of the first substrate 10, but not limited thereto. Additionally, in some embodiments, the resist layer 22 may include polymer material, resin material, or other suitable organic, inorganic, or organic/inorganic hybrid materials, and the resist layer 22 may be formed on the top surface TS1 of the first substrate 10 by a coating method or other suitable approaches. The coating method described above may include a spin coating method, a spray coating method, a slit coating method, or other suitable coating methods, but not limited thereto. Additionally, in some embodiments, the material of the resist layer 22 may be a curable material, the resist layer 22 may be cured by a curing process while the mold M1 is imprinted on the resist layer 22, and the curing process may including an optical curing process, a thermal curing process, or other suitable curing approaches, but not limited thereto.

In some embodiments, the mold M1 and the resist layer 22 may be separated from each other after the resist layer 22 is cured, and the embossed resist layer 22P may remain on the top surface TS1 of the first substrate 10. Additionally, in some embodiments, when the mold M1 is imprinted on the resist layer 22, some of the resist layer 22 may be still located between the protruding pattern P1 and the first substrate 10 in the vertical direction Z. In other words, in the first imprinting step, the mold M1 may not be in direct contact with the first substrate 10, but not limited thereto. In some embodiments, the first substrate 10 may include a region R11 and a region R12, the protruding patterns P1 of the mold M1 may be used to be imprinted on the resist layer 22 located on the region R11 for forming the corresponding recesses, and no recess is formed in the resist layer 22 located on the region R12 by the mold M1, but not limited thereto.

As shown in FIG. 3 and FIG. 4, after the first imprinting step, the resist layer 22 (i.e. the embossed resist layer 22P) may be used as an etching mask for performing the etching process 91 to the first substrate 10, so as to form the recess patterns C11 in the region R11 of the substrate 10. In some embodiments, the etching process 91 may include an anisotropic etching process, such as an anisotropic dry etching process, and the resist layer 22 may be removed after the etching process 91, but not limited thereto. Additionally, in the present invention, the resist layer (especially the cured resist layer) may be regarded as an etch resistant material, but a tiny portion of the resist layer may still be removed by the etching process, and the portion of the resist layer removed by the etching process may be regarded as the etching damage to the resist layer. Subsequently, as shown in FIG. 4 and FIG. 5, the resist layer 24 may be formed on the first substrate 10 after the etching process 91, and the second imprinting step using the mold M2 is then performed to the resist layer 24. In some embodiments, the resist layer 22 (i.e. the embossed resist layer 22P) may be removed before the resist layer 24 is formed, and the material and the forming method of the resist layer 24 may be identical to or similar to those of the resist layer 22 described above, but not limited thereto. In addition, the resist layer 24 maybe formed on the side of the top surface 51 of the first substrate 10, and the mold M2 may be imprinted on the resist layer 24 from the side of the top surface TS1 of the first substrate 10. The recess patterns C11 are formed before the step of forming the resist layer 24, and the recess patterns C11 may be filled with the resist layer 24 during the second imprinting step accordingly. In some embodiments, each of the recess patterns C11 may be fully filled with the resist layer 24, but not limited thereto.

In some embodiments, the mold M2 and the resist layer 24 may be separated from each other after the resist layer 24 is cured, and the embossed resist layer 24P may remain on the top surface TS1 of the first substrate 10. Additionally, in some embodiments, when the mold M2 is imprinted on the resist layer 24, some of the resist layer 24 may be still located between the protruding pattern P2 and the first substrate 10 in the vertical direction Z. In other words, in the second imprinting step, the mold M2 may not be in direct contact with the first substrate 10, but not limited thereto. The protruding patterns P2 of the mold M2 may be used to be imprinted on the resist layer 24 located on the region R12 for forming the corresponding recesses, and no recess is formed in the resist layer 24 located on the region R11 by the mold M2, but not limited thereto.

As shown in FIG. 5 and FIG. 6, after the second imprinting step, the resist layer 24 (i.e. the embossed resist layer 24P) may be used as an etching mask for performing the etching process 92 to the first substrate 10, so as to form the recess patterns C12 in the region R12 of the substrate 10. In some embodiments, the etching process 92 may include an anisotropic etching process, such as an anisotropic dry etching process, but not limited thereto. As shown in FIG. 6 and FIG. 7, the resist layer 24 may be removed after the etching process 92, and the first substrate 10 may include one or a plurality of recess patterns C11 in the region R11 and one or a plurality of recess patterns C12 in the region R12 after the first imprinting step, the second imprinting step, and the corresponding etching processes described above. The depth of each of the recess patterns C11 (such as a depth DP11 shown in FIG. 7) may be greater than the depth of each of the recess patterns C12 (such as a depth DP12 shown in FIG. 7). In some embodiments, the depth of the recess pattern in the first substrate 10 may be equal to a distance between a bottommost surface of the recess pattern and the top surface TS1 of the first substrate 10 in the vertical direction Z, and the bottommost surface of the recess pattern may be regarded as the portion of the recess pattern which is closest to the bottom surface BS1 of the first substrate 10 in the vertical direction Z, but not limited thereto.

As shown in FIG. 3, FIG. 4, and FIG. 7, the positions of the recess patterns C11 may be located corresponding to the positions of the protruding patterns P1 of the mold M1 in the vertical direction Z when the mold M1 is imprinted on the resist layer 22 in the first imprinting step, and the depth DP1 of the recess pattern C11 may be obtained by controlling the process parameters of the etching process 91 (such as etching time, but not limited thereto). As shown in FIG. 5, FIG. 6, and FIG. 7, the positions of the recess patterns C12 may be located corresponding to the positions of the protruding patterns P2 of the mold M2 in the vertical direction Z when the mold M2 is imprinted on the resist layer 24 in the second imprinting step, and the depth DP2 of the recess pattern C12 may be obtained by controlling the process parameters of the etching process 92 (such as etching time, but not limited thereto). In some embodiments, the process parameters of the etching process 91 shown in FIG. 4 may be different from those of the etching process 92 shown in FIG. 6 for forming the recess patterns with different depths in the first substrate 10. For example, for forming the deeper recess patterns C11, the corresponding etching process 91 may have stronger etching strength and/or longer etching time. Therefore, the first imprinting step and the etching process 91 for forming the recess patterns C11 may be carried out before the second imprinting step and the etching process 92 for forming the recess patterns C12, preferably, so as to avoid the condition where the recess patterns cannot be protected by the resist layer because of the etching damage to the resist layer.

In some embodiments, the width of each of the recess patterns C11 may be substantially equal to or different from the width of each of the recess patterns C12. The pattern density of the recess patterns C11 may be lower than the pattern density of the recess patterns C12. For example, the number per unit area of the recess patterns C11 in the region R11 may be less than the number per unit area of the recess patterns C12 in the region R12, and the distance DS11 between two of the recess patterns C11 adjacent to each other may be greater than the distance DS12 between two of the recess patterns C12 adjacent to each other. Additionally, in some embodiments, the first substrate 10 including the recess pattern C11 and the recess pattern C12 with different depths as shown in FIG. 7 may be formed by an imprinting step using a mold including protruding patterns with different heights imprinted on a resist layer formed on the first substrate 10 and the corresponding etching process according to some design considerations.

As shown in FIG. 8, a second substrate 20 may be provided, and a resist layer 26 may be formed on the second substrate 20. The material and the forming method of the resist layer 26 may be identical to or similar to those of the resist layer described above (such as the resist layer 22 shown in FIG. 3 and/or the resist layer 24 shown in FIG. 5), but not limited thereto. In addition, the second substrate 20 may include a silicon substrate (such as a silicon wafer), a silicon substrate with other material layers (such as a metal layer, a semiconductor layer, and/or a dielectric layer) formed thereon, or a substrate formed with other suitable materials. The second substrate 20 may have a top surface TS2 and a bottom surface BS2 opposite to the top surface TS2 in the vertical direction Z, and the material layer described above may be located at an area adjacent to the top surface TS2. For instance, the top surface TS2 may be the top surface of the material layer described above, but not limited thereto.

As shown in FIGS. 3-8, after the recess patterns C11 and the recess patterns C12 are formed, a third imprinting step using the first substrate 10 as a mold may be performed to the resist layer 26. The resist layer 26 may be formed on the side of the top surface TS2 of the second substrate 20, the first substrate 10 may be imprinted on the resist layer 26 from the side of the top surface TS2 of the second substrate 20, and the resist layer 22 and the resist layer 24 may be removed before the third imprinting step. In some embodiments, the second substrate 20 may include a region R21 and a region R22, the recess patterns C11 of the first substrate 10 may be used to be imprinted on the resist layer 26 located on the region R21, and the recess patterns C12 of the first substrate 10 may be used to be imprinted on the resist layer 26 located on the region R22. In the third imprinting step, the recess patterns C11 and the recess patterns C12 may be fully filled with the resist layer 26, but not limited thereto.

In some embodiments, the first substrate 10 and the resist layer 26 may be separated from each other after the resist layer 26 is cured, and the embossed resist layer 26P may remain on the top surface TS2 of the second substrate 20. Additionally, in some embodiments, when the first substrate 10 is imprinted on the resist layer 26, some of the resist layer 26 may be still located between the top surface TS1 of the first substrate 10 and the top surface TS2 of the second substrate 20 in the vertical direction Z. In other words, in the third imprinting step, the first substrate 10 may not be in direct contact with the second substrate 20, but not limited thereto. As shown in FIG. 8 and FIG. 9, after the third imprinting step, an etching process using the resist layer 26 (i.e. the embossed resist layer 26P) as an etching mask may be performed to the second substrate 20 so as to form a patterned structure in the second substrate 20. For example, after the etching process, one or a plurality of patterned structures FP1 may be formed in the region R21 of the second substrate 20, and one or a plurality of patterned structures FP2 may be formed in the region R21 of the second substrate 20. In some embodiments, the patterned structure FP1 and the patterned structure FP2 may be a patterned metal layer, a patterned semiconductor layer, a patterned dielectric layer, or other types of patterned structures on the silicon substrate. As shown in FIG. 8 and FIG. 9, the positions of the patterned structures FP1 may be located corresponding to the positions of the recess patterns C11 of the first substrate 10 in the vertical direction Z when the first substrate 10 is imprinted on the resist layer 26 in the third imprinting step, and the positions of the patterned structures FP2 may be located corresponding to the positions of the recess patterns C12 of the first substrate 10 in the vertical direction Z when the first substrate 10 is imprinted on the resist layer 26 in the third imprinting step. Therefore, the pattern density of the patterned structures FP1 may be less than the pattern density of the patterned structures FP2, and the distance between two of the patterned structures FP1 located adjacent to each other may be greater than the distance between two of the patterned structures FP2 located adjacent to each other. In addition, the width of each of the patterned structures FP1 may be substantially equal to or different from the width of each of the patterned structures FP2.

It is worth noting that, as shown in FIGS. 3-9, during the third imprinting step, although the pattern density of the recess patterns C11 is different from that of the recess patterns C12, the difference between the thickness of the resist layer 26 located between the recess patterns C11 adjacent to each other (such as a thickness TK1 of the resist layer 26 remains above the region R21 and located between the top surface TS1 of the first substrate 10 and the top surface TS2 of the second substrate 20 shown in FIG. 8) and the thickness of the resist layer 26 located between the recess patterns C12 adjacent to each other (such as a thickness TK2 of the resist layer 26 remains above the region R22 and located between the top surface TS1 of the first substrate 10 and the top surface TS2 of the second substrate 20 shown in FIG. 8) may be reduced because of the design where the depth of each of the recess patterns C11 is greater than the depth of each of the recess patterns C12. The pattern dimension control in the subsequent patterning process performed to the second substrate 20 may be improved accordingly. Comparatively, when a mold including recess patterns with the same depth and different pattern densities is imprinted on a resist layer located on a substrate, the thickness of the resist layer remaining on the lower pattern density region and located between the surface of the mold and the substrate will be obviously greater than the thickness of the resist layer remaining on the higher pattern density region and located between the surface of the mold and the substrate. The critical dimension of the patterned structure subsequently formed by the etching process using the embossed resist layer as an etching mask and performed to the substrate will be different from the design value accordingly, and the manufacturing yield will be affected. In other words, the imprint method described above may be used to improve the process uniformity and/or enhance the manufacturing yield.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 10:
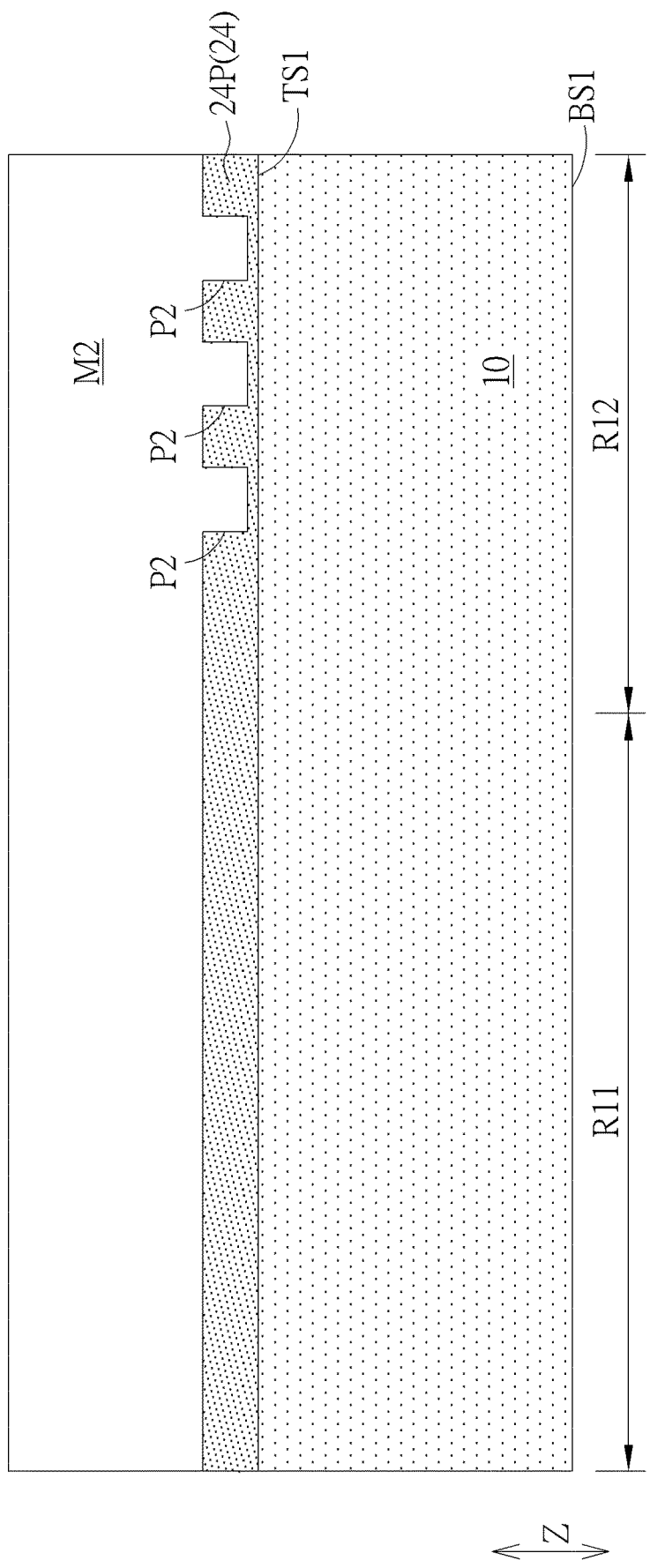
Figure 11:
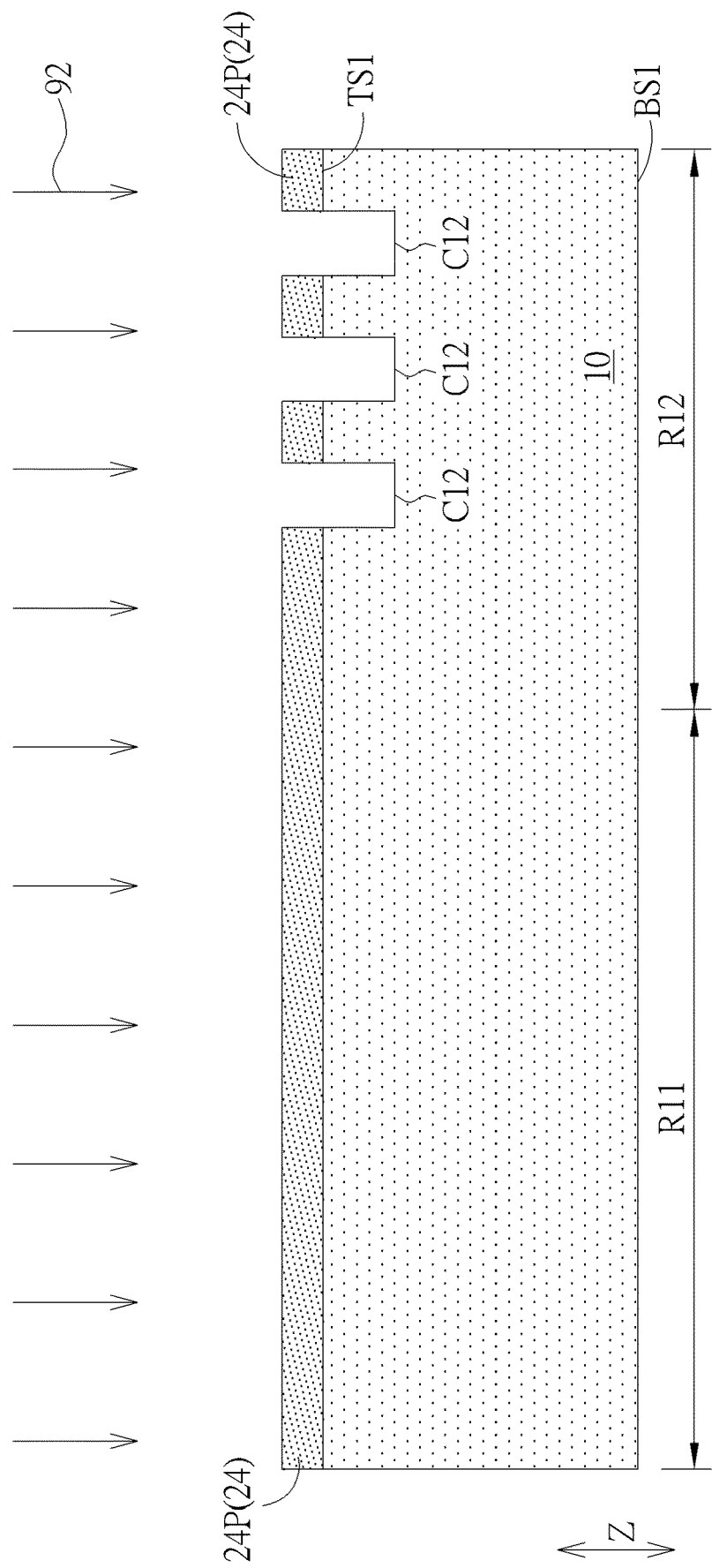
Figure 12:
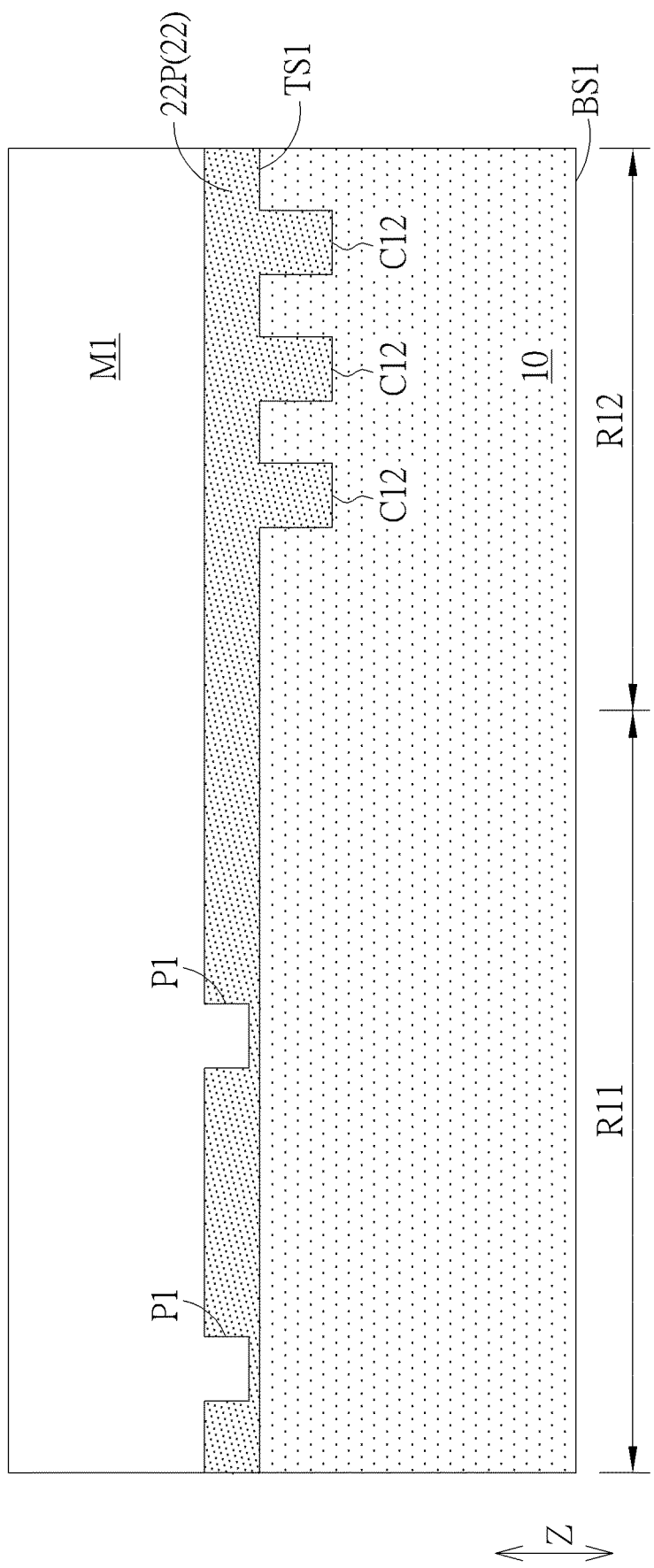
Figure 13:
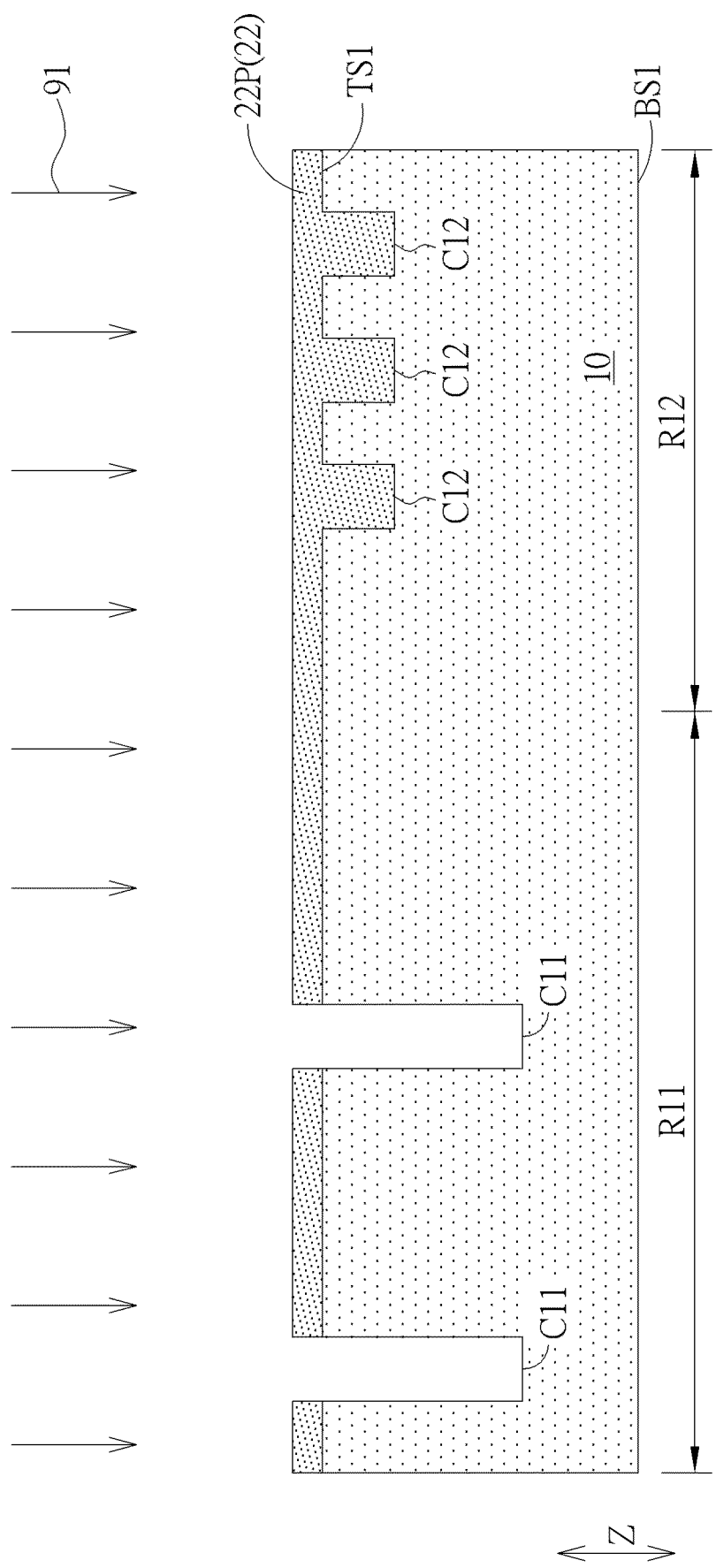

Please refer to FIGS. 10-13 and FIG. 7. FIGS. 10-13 are schematic drawings illustrating an imprint method according to a second embodiment of the present invention, wherein FIG. 10 is a schematic drawing illustrating the second imprinting step, FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, and FIG. 7 may be regarded as a schematic drawing in a step subsequent to FIG. 13. As shown in FIG. 10 and FIG. 11, in some embodiments, the second imprinting step using the mold M2 may be performed to the resist layer 24, and the etching process 92 may be performed to the first substrate 10 with the embossed resist layer 24P as an etching mask for forming the recess patterns C12. Subsequently, as shown in FIG. 12 and FIG. 13, the first imprinting step using the mold M1 may be performed to the resist layer 22, and the etching process 91 may be performed to the first substrate 10 with the embossed resist layer 22P as an etching mask for forming the recess patterns C11. In other words, as shown in FIGS. 10-13, the resist layer 22 may be formed after the etching process 92, and the resist layer 24 may be removed before the first resist layer 22 is formed. As shown in FIG. 13 and FIG. 7, the resist layer 22 may be removed after the etching process 91 so as to form the first substrate 10 including the recess pattern C11 and the recess pattern C12 with different depths as shown in FIG. 7. Additionally, the recess patterns C12 may be filled with the resist layer 22 during the first imprinting step shown in FIG. 12 because the first imprinting step is carried out after the etching process 92. In some embodiments, the recess patterns C12 may be fully filled with the resist layer 22, but not limited thereto.

Figure 14:
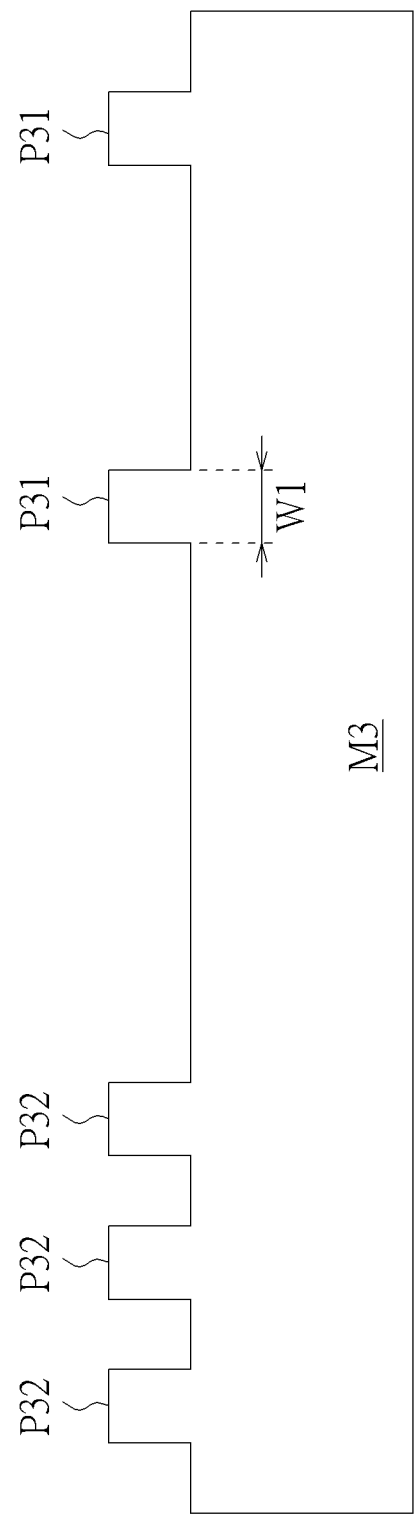
Figure 15:
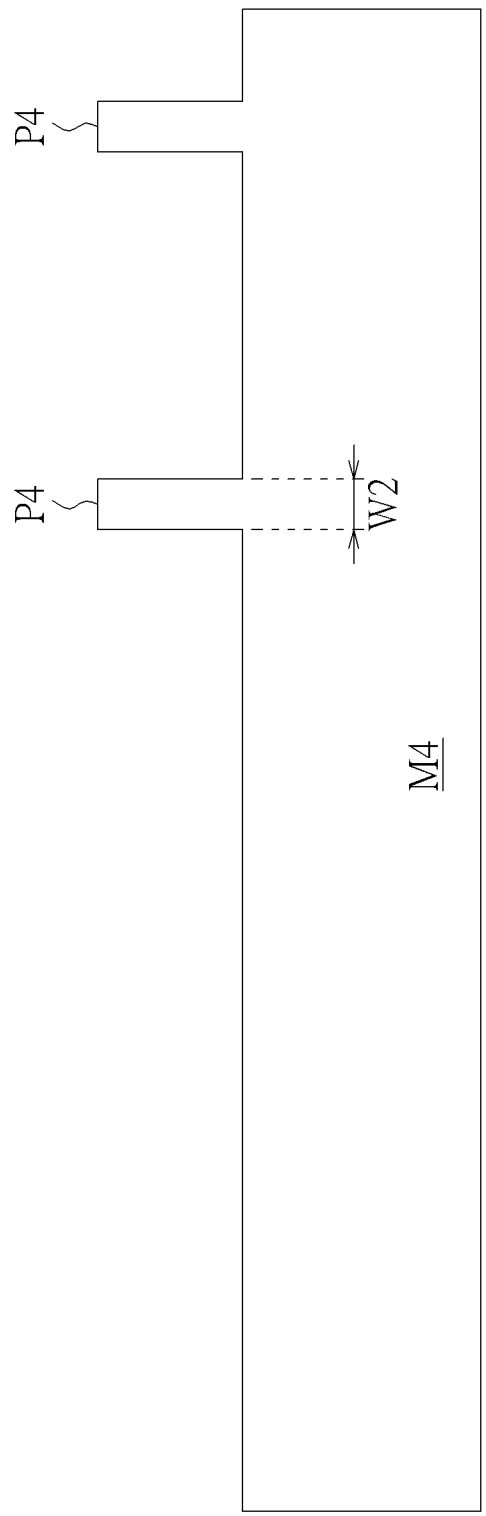
Figure 16:
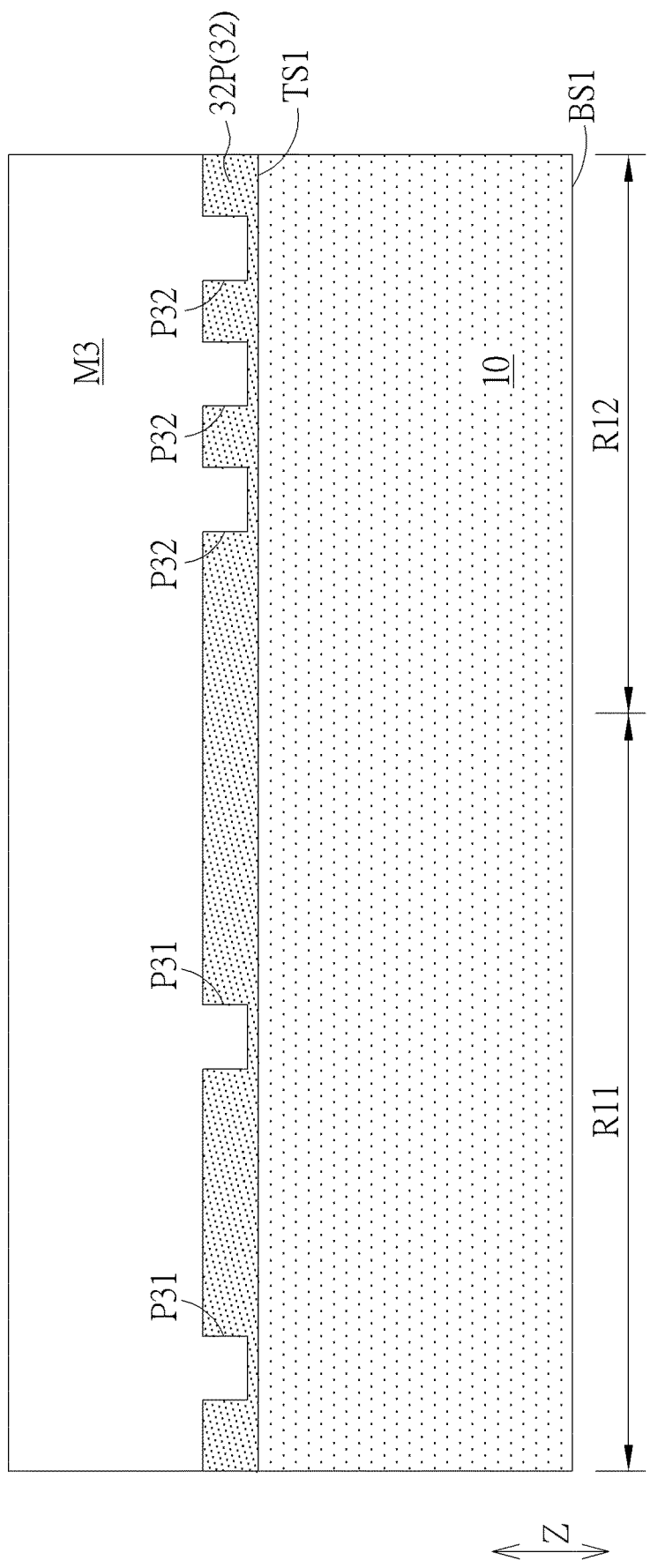
Figure 17:
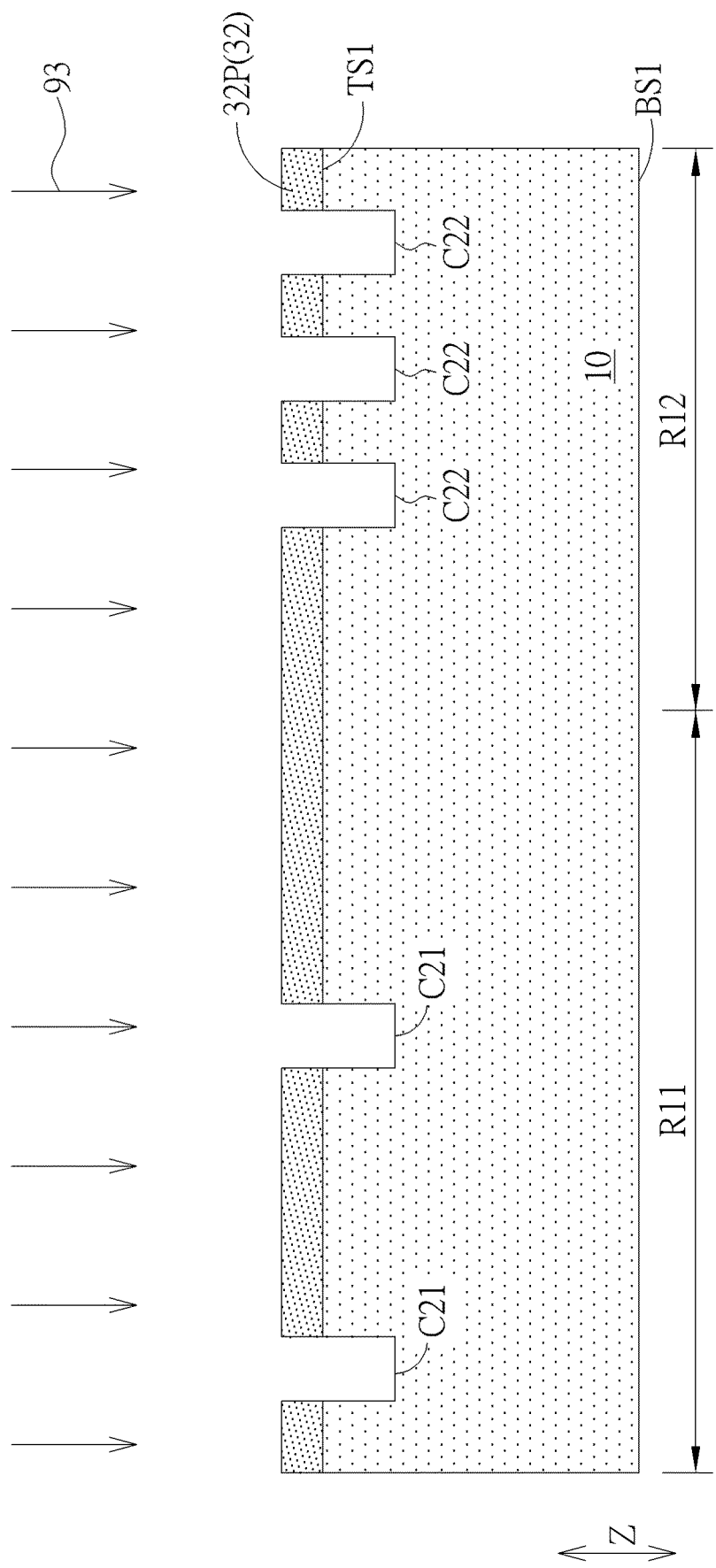
Figure 18:
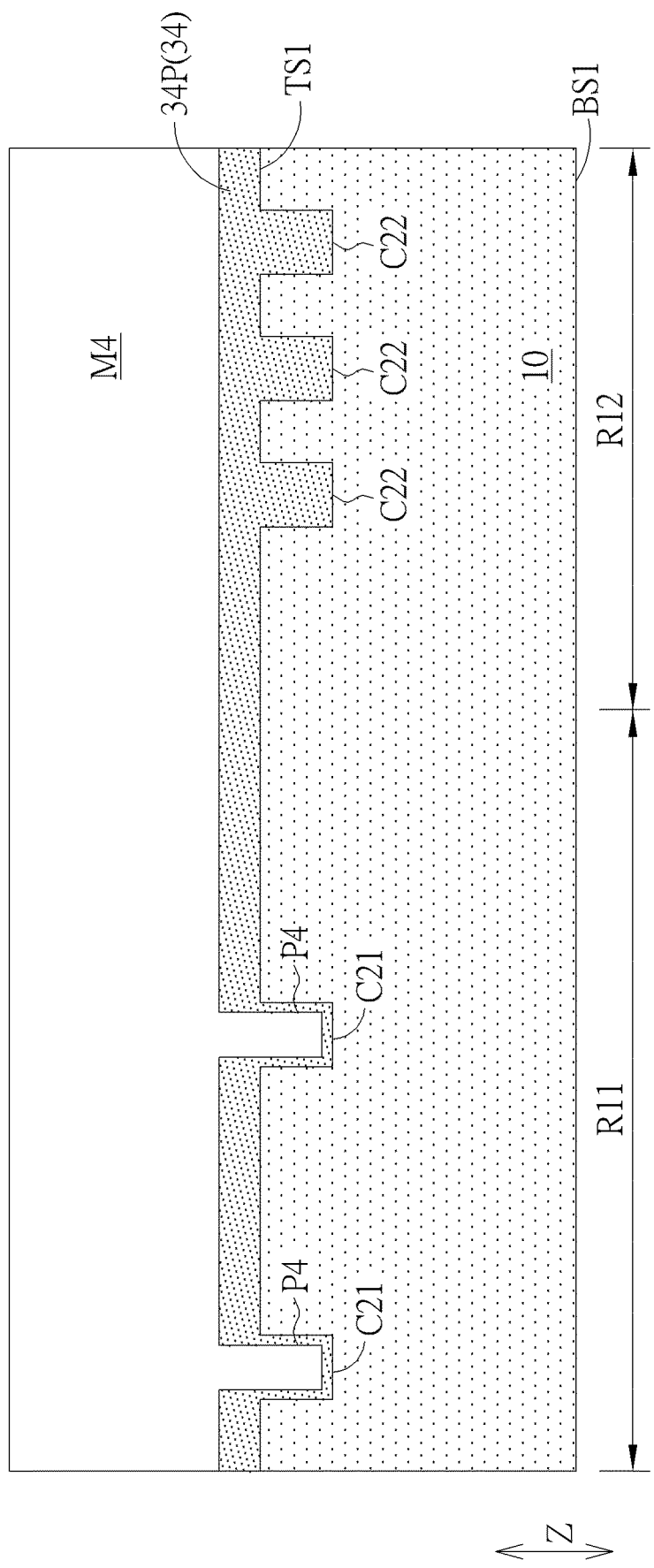
Figure 19:
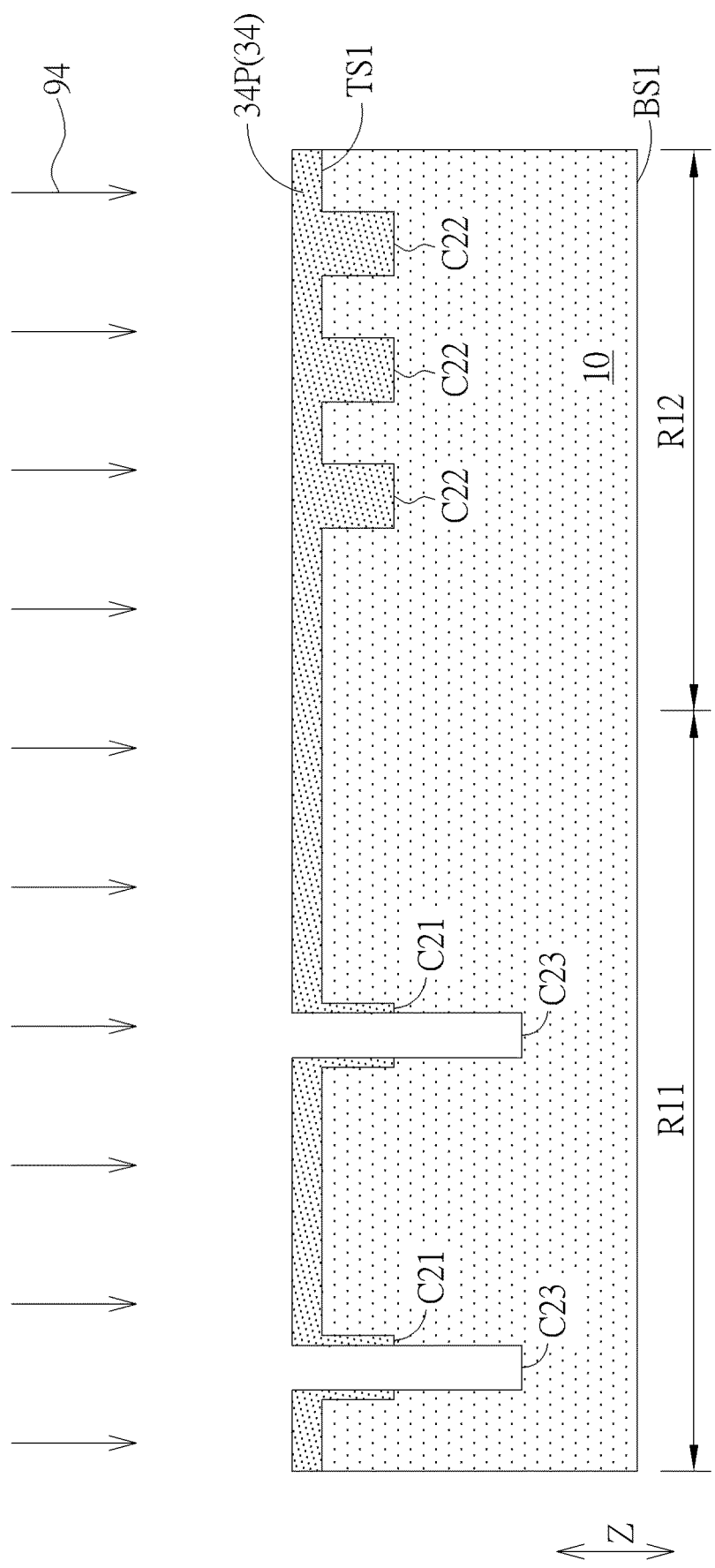
Figure 20:
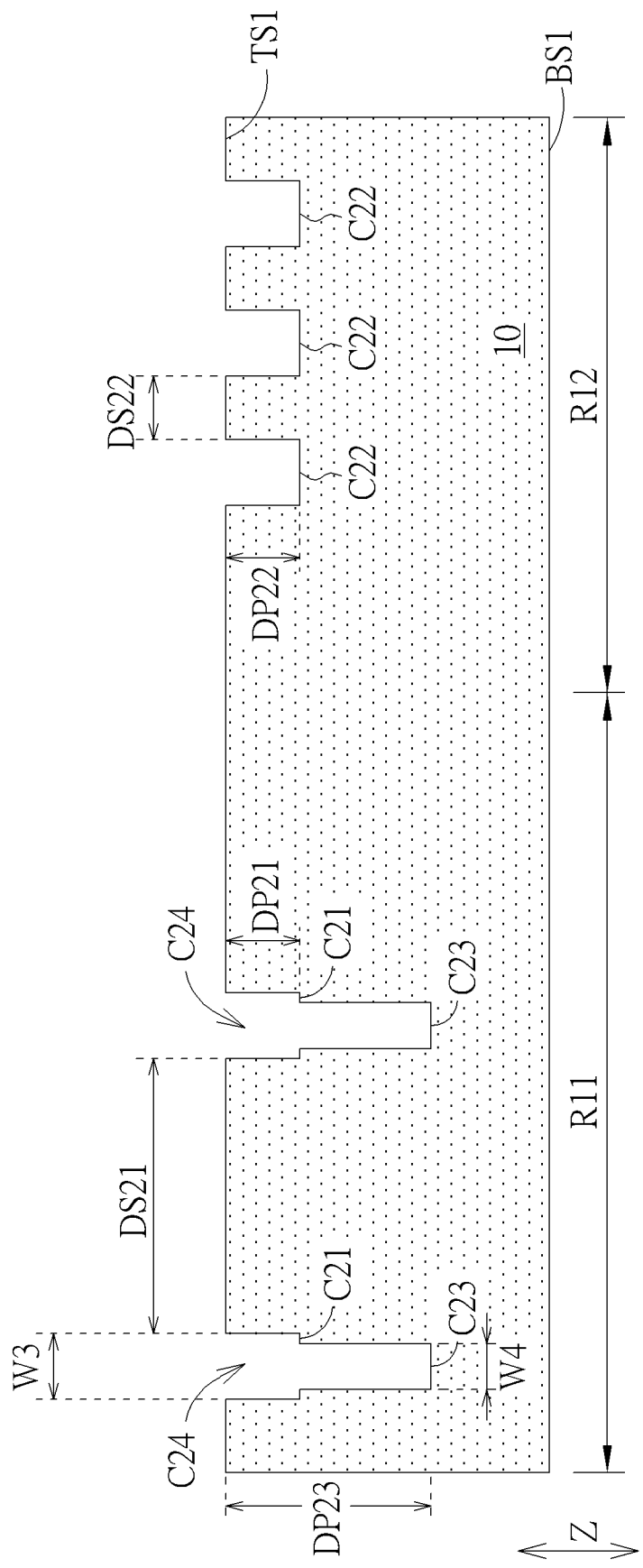
Figure 21:
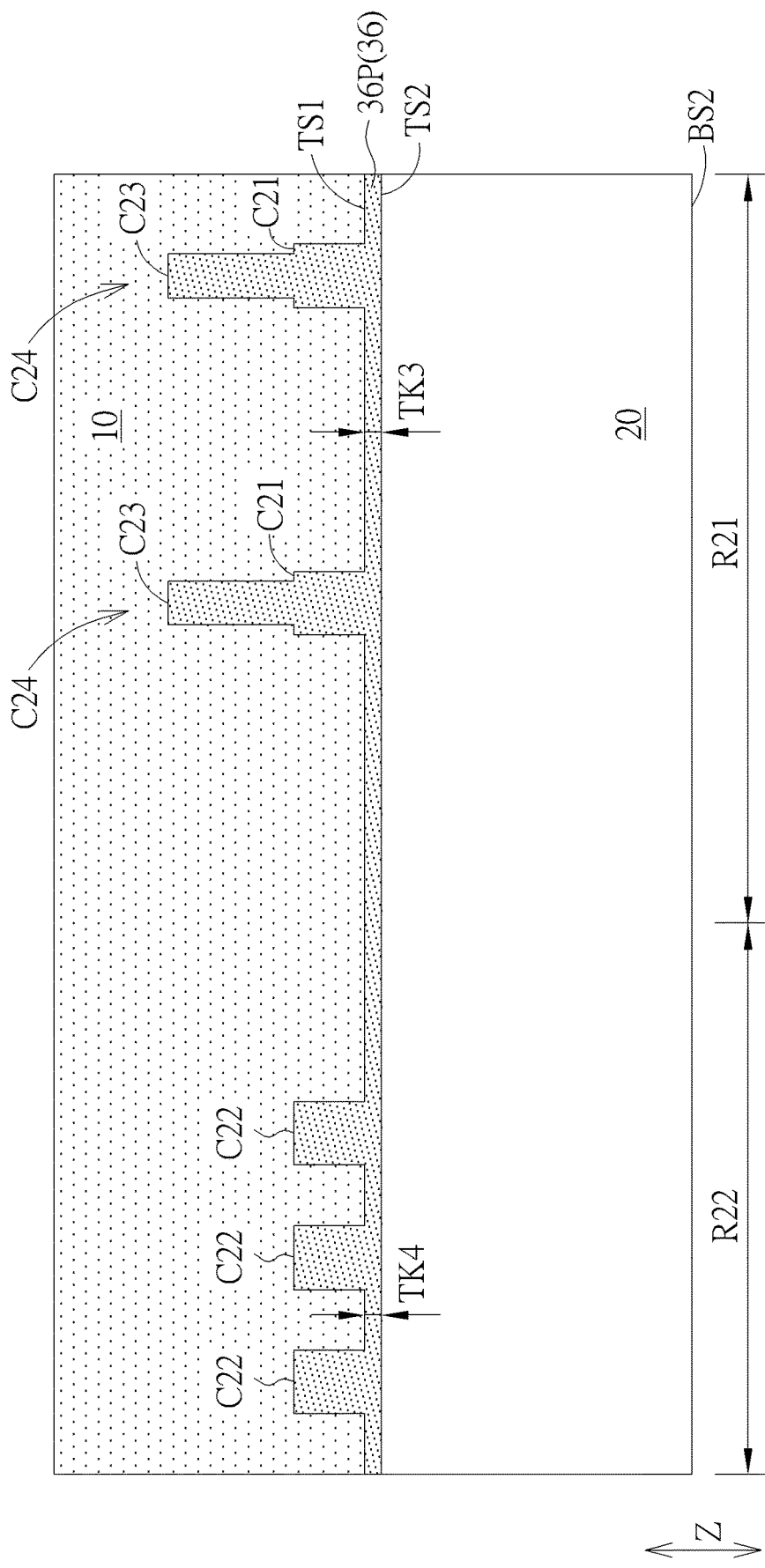

Please refer to FIGS. 14-21. FIGS. 14-21 are schematic drawings illustrating an imprint method according to a third embodiment of the present invention, wherein FIG. 14 is a schematic drawing illustrating a mold M3, FIG. 15 is a schematic drawing illustrating a mold M4, FIG. 16 is a schematic drawing illustrating an imprinting step, FIG. 17 is a schematic drawing in a step subsequent to FIG. 16, FIG. 18 is a schematic drawing in a step subsequent to FIG. 17, FIG. 19 is a schematic drawing in a step subsequent to FIG. 18, FIG. 20 is a schematic drawing in a step subsequent to FIG. 19, and FIG. 21 is a schematic drawing in a step subsequent to FIG. 20. The imprint method in this embodiment may include the following steps. As shown in FIG. 14 and FIG. 15, a first mold and a second mold (such as a mold M3 illustrated in FIG. 14 and a mold M4 illustrated in FIG. 15) are provided. The mold M3 may include a plurality of protruding patterns P31 and a plurality of protruding patterns P32, and the mold M4 may include a plurality of protruding patterns P4. As shown in FIG. 16, a resist layer 32 is formed on the first substrate 10, and an imprinting step using the mold M3 is performed to the resist layer 32. In some embodiments, the imprinting step using the mold M3 may be regarded as a first imprinting step, and FIG. 16 may be regarded as a schematic drawing illustrating the condition of the first imprinting step, but not limited thereto. As shown in FIG. 16 and FIG. 17, after the first imprinting step, an etching process 93 is then performed to the first substrate 10 with the resist layer 32 as an etching mask, so as to form one or a plurality of recess patterns C21 in the region R11 of the first substrate 10 and one or a plurality of recess patterns C22 in the region R12 of the first substrate 10. Subsequently, as shown in FIG. 18, another resist layer 34 is formed on the first substrate 10, and another imprinting step using the mold M4 is performed to the resist layer 34. In some embodiments, the imprinting step using the mold M4 may be regarded as a second imprinting step, and FIG. 18 may be regarded as a schematic drawing illustrating the condition of the second imprinting step, but not limited thereto. As shown in FIG. 18 and FIG. 19, after the second imprinting step, an etching process 94 is then performed to the first substrate 10 with the resist layer 34 as an etching mask, so as to form one or a plurality of recess patterns C23 in the first substrate 10. At least a part of the recess pattern C23 is formed under and connected with the recess pattern C21, and a depth of the recess pattern C23 is greater than a depth of each of the recess patterns C22.

Specifically, the material composition and the manufacturing method of the mold M3 and the mold M4 in this embodiment may be similar to those of the mold in the first embodiment described above, the material and the forming method of the resist layer 32 and the resist layer 34 in this embodiment may be identical to or similar to those of the resist layer in the first embodiment described above, and the etching process 93 and the etching process 94 in this embodiment may be similar to the etching process in the first embodiment described above. As shown in FIG. 14, in some embodiments, the mold M3 may include one or a plurality of the protruding patterns P31 and a plurality of the protruding patterns P32. The protruding pattern P31 may be used to form the corresponding recess pattern in the first substrate (such as the recess pattern C21 shown in FIG. 17), and the protruding patterns P32 may be used to form the corresponding recess patterns in the first substrate (such as the recess patterns C22 shown in FIG. 17). As shown in FIG. 16 and FIG. 17, the recess pattern C21 may be formed by transferring a shape of the protruding pattern P31 to the first substrate 10 via the first imprinting step and the etching process 93, and the recess pattern C22 may be formed by transferring a shape of the protruding pattern P32 to the first substrate 10 via the first imprinting step and the etching process 93. In some embodiments, the pattern density of the protruding patterns P31 on the mold M3 may be lower than the pattern density of the protruding patterns P32 on the mold M3. For instance, the distance between two of the protruding patterns P31 adjacent to each other may be greater than the distance between two of the protruding patterns P32 adjacent to each other, but not limited thereto. Additionally, the height and the width of each of the protruding patterns P31 may be substantially equal to or different from the height and the width of each of the protruding patterns P32.

As shown in FIG. 15, the mold M4 may include one or a plurality of protruding patterns P4, and the protruding pattern P4 may be used to form the corresponding recess pattern in the first substrate (such as the recess pattern C23 shown in FIG. 19). As shown in FIG. 18 and FIG. 19, the recess pattern C23 may be formed by transferring a shape of the protruding pattern P4 to the first substrate 10 via the second imprinting step and the etching process 94. Additionally, in the second imprinting step, at least a part of the protruding pattern P4 may be located within the recess pattern C21 for being imprinted on the resist layer 34 in the recess pattern C21. Therefore, as shown in FIG. 14 and FIG. 15, a width W1 of the protruding pattern P31 may be greater than a width W2 of the protruding pattern P4, and at least a part of the protruding pattern P4 may be located in the recess pattern C21 during the second imprinting step shown in FIG. 18 for generating the required imprinting effect accordingly. Additionally, in some embodiments, the protruding height of the protruding pattern P4 may be greater than that of the protruding pattern P31, but not limited thereto.

As shown in FIG. 16 and FIG. 17, in some embodiments, the mold M3 and the resist layer 32 may be separated from each other after the resist layer 32 is cured, and the embossed resist layer 32P may remain on the top surface TS1 of the first substrate 10. Additionally, in some embodiments, when the mold M3 is imprinted on the resist layer 32, some of the resist layer 32 may be still located between the protruding pattern P31 and the first substrate 10 in the vertical direction Z and located between the protruding pattern P32 and the first substrate 10 in the vertical direction Z. In other words, in the first imprinting step, the mold M3 may not be in direct contact with the first substrate 10, but not limited thereto. In some embodiments, the protruding patterns P31 of the mold M3 may be used to be imprinted on the resist layer 32 located on the region R11 for forming the corresponding recesses, and the protruding patterns P32 of the mold M3 may be used to be imprinted on the resist layer 32 located on the region R12 for forming the corresponding recesses. Additionally, in some embodiments, the pattern density of the recess patterns C21 may be lower than a pattern density of the recess patterns C22. For instance, a distance between two of the recess patterns C21 adjacent to each other may be greater than a distance between two of the recess patterns C22 adjacent to each other, but not limited thereto. In addition, a depth of each of the recess patterns C21 may be substantially equal to a depth of each of the recess patterns C22, and a width of each of the recess patterns C21 may be substantially equal to or different from a width of each of the recess patterns C22.

As shown in FIGS. 17-19, the resist layer 34 may be formed after the etching process 93, the resist layer 32 may be removed before the resist layer 34 is formed, and the recess patterns C21 and the recess patterns C22 may be filled with the resist layer 34 before the second imprinting step. In some embodiments, the mold M4 and the resist layer 34 may be separated from each other after the resist layer 34 is cured, and the embossed resist layer 34P may remain on the top surface TS1 of the first substrate 10. Additionally, in some embodiments, when the mold M4 is imprinted on the resist layer 34, the recess patterns C22 may be filled with the resist layer 34, a part of the protruding pattern P4 may be located within the recess pattern C21 for being imprinted on the resist layer 34 in the recess pattern C21, and some of the resist layer 34 may be still located between the protruding pattern P4 and the bottom of the recess pattern C21 in the vertical direction Z. In other words, in the second imprinting step, the mold M4 may not be in direct contact with the first substrate 10, but not limited thereto.

As shown in FIGS. 18-20, after the second imprinting step, the resist layer 34 (i.e. the embossed resist layer 34P) may be used as an etching mask for performing the etching process 94 to the first substrate 10, so as to form the recess patterns C23 in the region R11 of the substrate 10. Additionally, the resist layer 34 may be removed after the etching process 94, and the first substrate 10 may include one or a plurality of the recess patterns C21 and one or a plurality of the recess patterns C23 in the region R11 and one or a plurality of recess patterns C22 in the region R12 after the first imprinting step, the second imprinting step, and the corresponding etching processes described above. In some embodiments, at least a part of each of the recess patterns C23 may be formed underneath and connected with the corresponding recess pattern C21, and each of the recess patterns C23 and the corresponding recess pattern C21 may be regarded as one recess pattern C24 accordingly, but not limited thereto. In some embodiments, a width of the recess pattern C21 may be greater than a width of the recess pattern C23, and the recess pattern C24 may be regarded as a recess pattern with a narrower lower part and a wider upper part. Additionally, a depth DP23 of each of the recess patterns C24 (may also be regarded as the depth of each of the recess patterns C23) may be greater than a depth DP22 of each of the recess patterns C22, and a depth DP21 of each of the recess patterns C21 may be substantially equal to the depth DP22 of each of the recess patterns C22, but not limited thereto. Additionally, in some embodiments, the pattern density of the recess patterns C24 may be lower than the pattern density of the recess patterns C22. For instance, a distance DS21 between two of the recess patterns C24 adjacent to each other may be greater than a distance DS22 between two of the recess patterns C22 adjacent to each other, but not limited thereto.

As shown in FIG. 21, the second substrate 20 may be provided, a resist layer 36 may be formed on the second substrate 20, and the material and the forming method of the resist layer 36 may be identical to or similar to those of the resist layers described above, but not limited thereto. As shown in FIG. 20 and FIG. 21, after the recess patterns C22 and the recess patterns C24 are formed, a third imprinting step using the first substrate 10 as a mold may be performed to the resist layer 36. The resist layer 36 may be formed on the side of the top surface TS2 of the second substrate 20, the first substrate 10 may be imprinted on the resist layer 26 from the side of the top surface TS2 of the second substrate 20. In some embodiments, the recess patterns C24 of the first substrate 10 may be used to be imprinted on the resist layer 36 located on the region R21, and the recess patterns C22 of the first substrate 10 may be used to be imprinted on the resist layer 36 located on the region R22. In the third imprinting step, the recess patterns C24 (i.e. the recess patterns C21 and the recess patterns C23) and the recess patterns C22 may be filled with the resist layer 36. In some embodiments, the recess patterns C24 and the recess patterns C22 may be fully filled with the resist layer 36, but not limited thereto.

In some embodiments, the first substrate 10 and the resist layer 36 may be separated from each other after the resist layer 36 is cured, and the embossed resist layer 36P may remain on the top surface TS2 of the second substrate 20. Additionally, in some embodiments, when the first substrate 10 is imprinted on the resist layer 36, some of the resist layer 36 may be still located between the top surface TS1 of the first substrate 10 and the top surface TS2 of the second substrate 20 in the vertical direction Z. In other words, in the third imprinting step, the first substrate 10 may not be in direct contact with the second substrate 20, but not limited thereto. In some embodiments, after the third imprinting step, an etching process using the resist layer 36 (i.e. the embossed resist layer 36P) as an etching mask may be performed to the second substrate 20 so as to form a patterned structure in the second substrate 20 (such as the patterned structure FP1 and the pattern structure FP2 illustrated in FIG. 9), but not limited thereto. As shown in FIG. 21, during the third imprinting step, although the pattern density of the recess patterns C24 is different from that of the recess patterns C22, the difference between the thickness of the resist layer 36 located between the recess patterns C24 adjacent to each other (such as a thickness TK3 of the resist layer 36 remains above the region R21 and located between the top surface TS1 of the first substrate 10 and the top surface TS2 of the second substrate 20 shown in FIG. 21) and the thickness of the resist layer 36 located between the recess patterns C22 adjacent to each other (such as a thickness TK4 of the resist layer 36 remains above the region R22 and located between the top surface TS1 of the first substrate 10 and the top surface TS2 of the second substrate 20 shown in FIG. 21) may be reduced because of the design where the depth of each of the recess patterns C24 is greater than the depth of each of the recess patterns C22. The pattern dimension control in the subsequent patterning process performed to the second substrate 20 may be improved accordingly.

To summarize the above descriptions, according to the imprint method in the present invention, the imprinting steps and the corresponding etching processes may be used to form the recess patterns with different depths in the substrate. In addition, the substrate including the recess patterns with different depths and different pattern densities may be used as a mold for performing the imprinting step, the pattern dimension control in the patterning process performed subsequent to this imprinting step may be improved accordingly, and the purposes of process uniformity improvement and/or manufacturing yield enhancement may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An imprint method, comprising:
   forming a first resist layer on a first substrate;
   performing a first imprinting step using a first mold to the first resist layer;
   performing a first etching process to the first substrate with the first resist layer as an etching mask after the first imprinting step so as to form at least one first recess pattern in the first substrate;
   forming a second resist layer on the first substrate;
   performing a second imprinting step using a second mold to the second resist layer; and
   performing a second etching process to the first substrate with the second resist layer as an etching mask after the second imprinting step so as to form second recess patterns in the first substrate, wherein a depth of the at least one first recess pattern is greater than a depth of each of the second recess patterns.

2. The imprint method according to claim 1, wherein the second resist layer is formed after the first etching process, and the first resist layer is removed before the second resist layer is formed.

3. The imprint method according to claim 2, wherein the at least one first recess pattern is filled with the second resist layer during the second imprinting step.

4. The imprint method according to claim 1, wherein the first resist layer is formed after the second etching process, and the second resist layer is removed before the first resist layer is formed.

5. The imprint method according to claim 4, wherein the second recess patterns are filled with the first resist layer during the first imprinting step.

6. The imprint method according to claim 1, wherein a pattern density of the at least one first recess pattern is lower than a pattern density of the second recess patterns.

7. The imprint method according to claim 1, wherein a plurality of the first recess patterns are formed in the first substrate by the first etching process, wherein a distance between two of the first recess patterns adjacent to each other is greater than a distance between two of the second recess patterns adjacent to each other.

8. The imprint method according to claim 1, further comprising:
   forming a third resist layer on a second substrate; and
   performing a third imprinting step using the first substrate as a mold to the third resist layer after the at least one first recess pattern and the second recess patterns are formed.

9. The imprint method according to claim 8, wherein the first resist layer and the second resist layer are removed before the third imprinting step.

10. The imprint method according to claim 8, wherein the at least one first recess pattern and the second recess patterns are filled with the third resist layer in the third imprinting step.

11. An imprint method, comprising:
    forming a first resist layer on a first substrate;
    performing a first imprinting step using a first mold to the first resist layer;
    performing a first etching process to the first substrate with the first resist layer as an etching mask after the first imprinting step so as to form at least one first recess pattern in a first region of the first substrate and second recess patterns in a second region of the first substrate;
    forming a second resist layer on the first substrate;
    performing a second imprinting step using a second mold to the second resist layer; and
    performing a second etching process to the first substrate with the second resist layer as an etching mask after the second imprinting step so as to form at least one third recess pattern in the first region of the first substrate, wherein at least a part of the at least one third recess pattern is formed under and connected with the at least one first recess pattern, and a depth of the at least one third recess pattern is greater than a depth of each of the second recess patterns.

12. The imprint method according to claim 11, wherein the second resist layer is formed after the first etching process, the first resist layer is removed before the second resist layer is formed, and the at least one first recess pattern and the second recess patterns are filled with the second resist layer before the second imprinting step.

13. The imprint method according to claim 11, wherein the first mold comprises at least one first protruding pattern for forming the at least one first recess pattern, wherein the at least one first recess pattern is formed by transferring a shape of the at least one first protruding pattern to the first substrate via the first imprinting step and the first etching process.

14. The imprint method according to claim 13, wherein the second mold comprises at least one second protruding pattern, and at least a part of the at least one second protruding pattern is located within the at least one first recess pattern in the second imprinting step.

15. The imprint method according to claim 14, wherein a width of the at least one first protruding pattern is greater than a width of the at least one second protruding pattern.

16. The imprint method according to claim 11, wherein a width of the at least one first recess pattern is greater than a width of the at least one third recess pattern.

17. The imprint method according to claim 11, wherein a depth of the at least one first recess pattern is equal to the depth of each of the second recess patterns.

18. The imprint method according to claim 11, wherein a pattern density of the at least one first recess pattern is lower than a pattern density of the second recess patterns.

19. The imprint method according to claim 11, further comprising:
    forming a third resist layer on a second substrate; and
    performing a third imprinting step using the first substrate as a mold to the third resist layer after the at least one first recess pattern, the second recess patterns, and the at least one third recess pattern are formed.

20. The imprint method according to claim 19, wherein the at least one first recess pattern, the second recess patterns, and the at least one third recess pattern are filled with the third resist layer in the third imprinting step.

* * * * *